(12) United States Patent
Yu

(10) Patent No.: US 6,756,835 B2
(45) Date of Patent: Jun. 29, 2004

(54) LEVEL SHIFTING CIRCUIT

(75) Inventor: Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/341,740

(22) Filed: Jan. 14, 2003

(65) Prior Publication Data

US 2003/0227315 A1 Dec. 11, 2003

(30) Foreign Application Priority Data

Jun. 11, 2002 (TW) .................................. 91112709 A

(51) Int. Cl.[7] .............................................. H03L 5/00
(52) U.S. Cl. ........................................ 327/333; 326/81
(58) Field of Search ............................ 327/333; 326/63, 326/68, 80, 81

(56) References Cited

U.S. PATENT DOCUMENTS

| 5,387,828 A | | 2/1995 | Nakano ........................ 326/68 |
| 5,659,258 A | * | 8/1997 | Tanabe et al. .................. 326/68 |
| 6,359,491 B1 | * | 3/2002 | Cairns et al. ................. 327/333 |

FOREIGN PATENT DOCUMENTS

JP   2001-024503   1/2001   ....... H03K/19/0185

* cited by examiner

Primary Examiner—Terry D. Cunningham
(74) Attorney, Agent, or Firm—Fish & Richardson P.C.

(57) ABSTRACT

A level shifting circuit. The gate of the PMOS transistor is coupled to an input terminal, and the source of the PMOS transistor is coupled to a power source. The drain of the NMOS transistor is coupled to the drain of the PMOS transistor. The source of the NMOS transistor is coupled to a reverse input terminal. The gate of the NMOS transistor is coupled to the power source. The reverse logic gate having a first terminal is coupled to the drain of the NMOS transistor and a second terminal is coupled to the output terminal.

11 Claims, 9 Drawing Sheets

LEVEL SHIFTING CIRCUIT

CROSS REFERENCE TO RELATED APPLICATIONS

Pursuant to 35 USC §119, this application claims the benefit of Taiwan Application No. 091112709 filed June 11, 2002.

BACKGROUND OF THE INVENTION

1. Field of the Invention

The present invention relates in general to a level shifting circuit. In particular, the present invention relates to a level shifting circuit for metal-oxide-semiconductor (MOS) transistors with relatively high threshold voltage.

2. Description of the Related Art

Level shifting circuits adjust the input voltage level for specific units. FIG. 1 shows a circuit diagram of a conventional level shifting circuit. The conventional level shifting circuit controls a NMOS transistor by a complementary pair of small signals Vin and XVin to lower the small signal with lower level to VSS or raise the small signal with higher level to VDD.

The conventional level shifting circuit comprises PMOS transistors P1 and P1', whose sources are coupled to a first power source (9V as an example) with gates coupled to each other's drains, wherein the connection points are labels 10 and 12. The drains of the NMOS transistors N1 and N1' are coupled to the connection points 10 and 12. The sources of the NMOS transistors N1 and N1' are coupled to VSS, and the gates of the NMOS transistors N1 and N1' are controlled by the input signals Vin and XVin, respectively. Here, the voltage level of XVin is reversed to Vin. When Vin is at high level (3.3V as an example), XVin is at low level (0V as an example). Therefore, NMOS transistor N1 is turned on and lowers the voltage level of the connection point 10 to VSS. Thus, the PMOS P1' is turned on. Since the NMOS transistor N1' is turned off, the signal output from output terminal Vout is VDD. On the contrary, when Vin is at low level, XVin is at high level (3.3V). Therefore, NMOS transistor N1' is turned on and lowers the voltage level of the connection point 12 to VSS. Thus, the signal output from output terminal Vout is VSS.

To increase voltage lowering rate of the connection points 10 and 12, NMOS transistors N2 and N2' are added. The gates of the NMOS transistors N2 and N2' are coupled to VCC, 3.3V as an example. Thus, the NMOS transistors N2 and N2' are turned on. Therefore, the voltage lowering rate of the connection points 10 and 12 is increased when the NMOS transistors N1 or N1' are turned on. Thus, the operating rate of the level shifting circuit is increased, and the timing error is prevented.

However, the conventional level shifting circuit described above is not suited to circuits based on low temperature poly silicon (LTPS hereinafter). The threshold voltage of the LTPS MOS transistor is around 2.5V. Thus, the NMOS transistors N2 and N2' in FIG. 1 cannot be well turned on. Therefore, the conventional level shifting circuits meet serious RC delay in high operation frequency when applied to LTPS field.

SUMMARY OF THE INVENTION

The object of the present invention is to provide a level shifting circuit to ensure high level input signal transforming to VDD and the low level input signal transforming to VSS even when the voltage level of the input signal is swimming.

To achieve the above-mentioned object, the level shifting circuit of the present invention includes a PMOS transistor, a NMOS transistor, and a reverse logic gate. The gate of the PMOS transistor is coupled to an input terminal, and the source of the PMOS transistor is coupled to a power source. The drain of the NMOS transistor is coupled to the drain of the PMOS transistor. The source of the NMOS transistor is coupled to a reverse input terminal. The gate of the NMOS transistor is coupled to the power source. The reverse logic gate, having a first terminal is coupled to the drain of the NMOS transistor and a second terminal is coupled to the output terminal.

Moreover, the level shifting circuit of the present invention includes a first PMOS transistor, a first NMOS transistor, a second PMOS transistor and a second NMOS transistor. The first PMOS transistor comprises a first drain, a first gate coupled to an input terminal, and a first source coupled to a power source. The first NMOS transistor comprises a second drain coupled to the first drain, a second source coupled to a reverse input terminal and a second gate coupled to the power source. The second PMOS transistor comprises a third gate coupled to the first drain, a third drain coupled to an output terminal and a third source coupled to the power source. The second NMOS transistor comprises a fourth gate coupled to the second gate, a fourth drain coupled to the output terminal and a fourth source coupled to the input terminal.

Moreover, the level shifting circuit of the present invention includes a first PMOS transistor, a voltage difference element, a second PMOS transistor, a first NMOS transistor, and a second NMOS transistor. The first PMOS transistor comprises a first drain, a first gate coupled to an input terminal and a first source coupled to a power source. The voltage difference element includes a first terminal coupled to the first drain, and a second terminal. The second PMOS transistor comprises a second source coupled to the power source, a second gate coupled to the second terminal and a second drain coupled to an output terminal. The first NMOS transistor comprises a third drain coupled to the second gate, a third gate coupled to the first drain and a third source coupled to a reverse input terminal. The second NMOS transistor comprises a fourth source coupled to the input terminal, a fourth drain coupled to the output terminal and a fourth gate coupled to the first drain.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

First Embodiment

Figure 1:
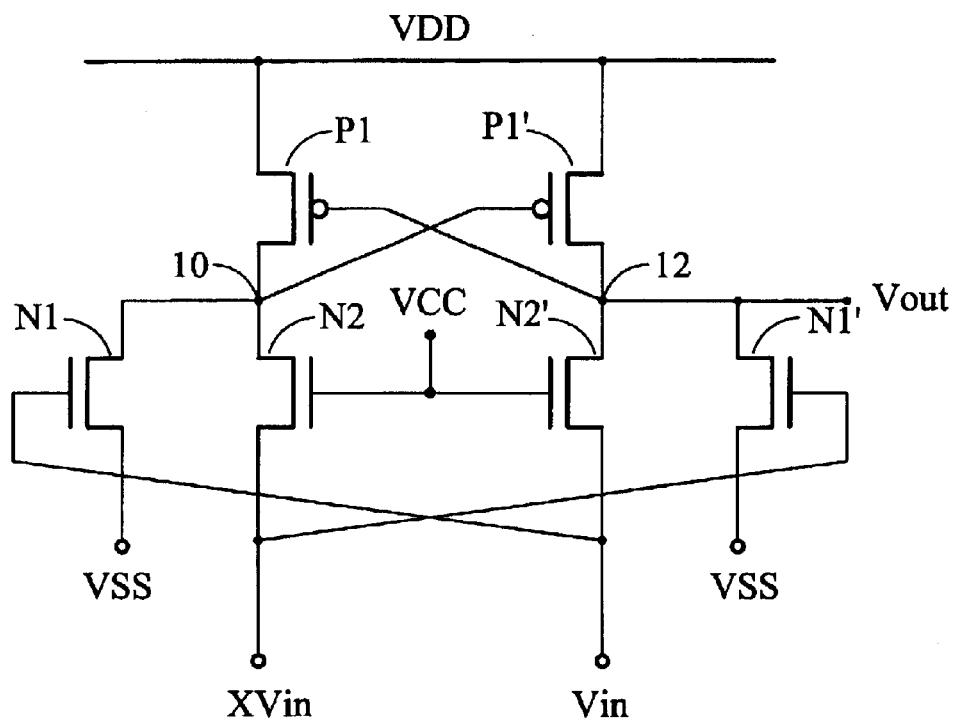
FIG. 1 shows a conventional level shifting circuit.
Figure 2:
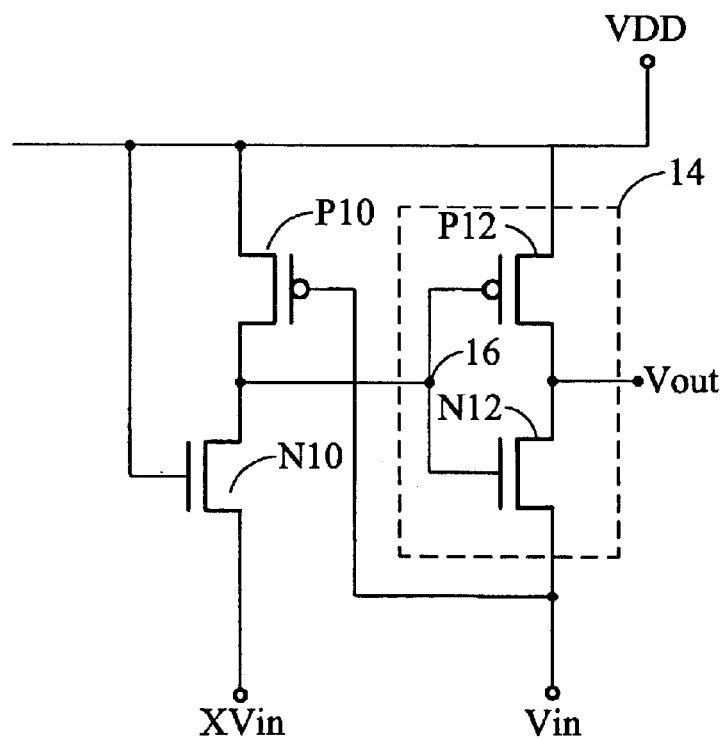
FIG. 2 shows a level shifting circuit according to the first embodiment of the present invention.

FIG. 2 shows a level shifting circuit according to the first embodiment of the present invention. The gate of the PMOS transistor P10 is coupled to an input terminal Vin, the source of the PMOS transistor P10 is coupled to the outside power source VDD (9V). The drain of the NMOS transistor N10 is coupled to the drain of the PMOS transistor P10, the source of the NMOS transistor N10 is coupled to the inverse input terminal XVin, and the gate of the NMOS transistor N10 is coupled to outside power source VDD.

In addition, the level shifting circuit according to the first embodiment of the present invention further comprises an inverse logic gate 14 coupled between the outside power source VDD and the input terminal Vin. The inverse logic gate 14 is composed of a PMOS transistor P12 and a NMOS transistor N12. The gate of the PMOS transistor P12 is coupled to the gate of the NMOS transistor N12. The connection point 16 is coupled to the drains of the PMOS transistor P10 and the NMOS transistor N10. In addition, the output terminal Vout of the level shifting circuit is coupled to the drains of the PMOS transistor P12 and the NMOS transistor N12, and the source of the NMOS transistor N12 is coupled to the input terminal Vin.

The operation of the level shifting circuit according to the first embodiment of the present invention is described below. The voltage levels of the Vin and XVin are inversed. When Vin is high level (3.3V for example), the XVin is low level. The gate of the NMOS transistor N10 is coupled to VDD, so the NMOS transistor N10 is turned on. Therefore, the low level signal provided by the inverse input terminal XVin lowers the voltage level of the connection point 16 to low level. Thus, the PMOS transistor P12 is turned on and the voltage VDD, about 9V, is output from the output terminal Vout.

When Vin is low level, the XVin is high level (3.3V for example). Because the NMOS transistor N10 stays on, the high level signal provided by the inverse input terminal XVin raises the voltage level of the connection point 16 to high level. In addition, the PMOS transistor P10 is turned on by the low voltage level signal provided by the input terminal Vin, therefore the voltage-raising rate of the connection point 16 is increased. Next, the NMOS transistor N12 is turned on, so the low voltage level signal is output from the output terminal Vout.

Figure 3A:
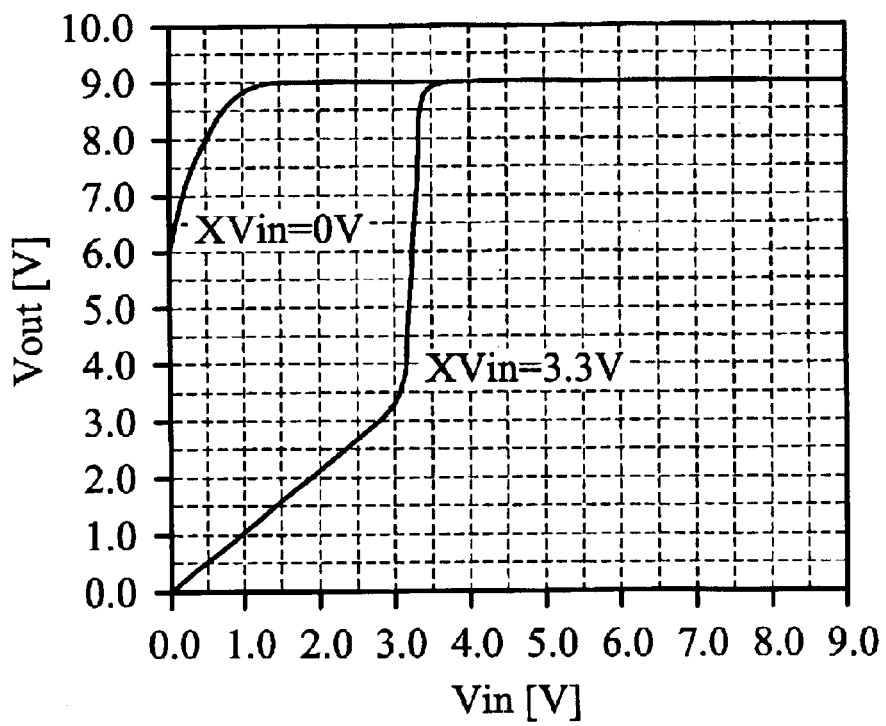
FIG. 3A is the simulated output characteristic chart of the level shifting circuit according to the first embodiment of the present invention.

FIG. 3A shows the simulated output characteristic chart of the level shifting circuit according to the first embodiment of the present invention. Here, the threshold voltage of the transistor is 2.5V, and the electron mobility is 40 cm$^2$/Vs and W/L is 1. The curve [XVin=3.3v] represents the output voltage of Vout when the constant voltage 3.3V is input to XVin, and voltage from 0V to 9V is input to the input terminal Vin. The other curve represents the output voltage of Vout when the constant voltage 0V is input to XVin, and voltage from 9V to 0V is input to the input terminal Vin. As shown in FIG. 3A, the level shifting circuit according to the first embodiment of the present invention separates the small signals with high and low levels and is allowed high tolerance.

Figure 3B:
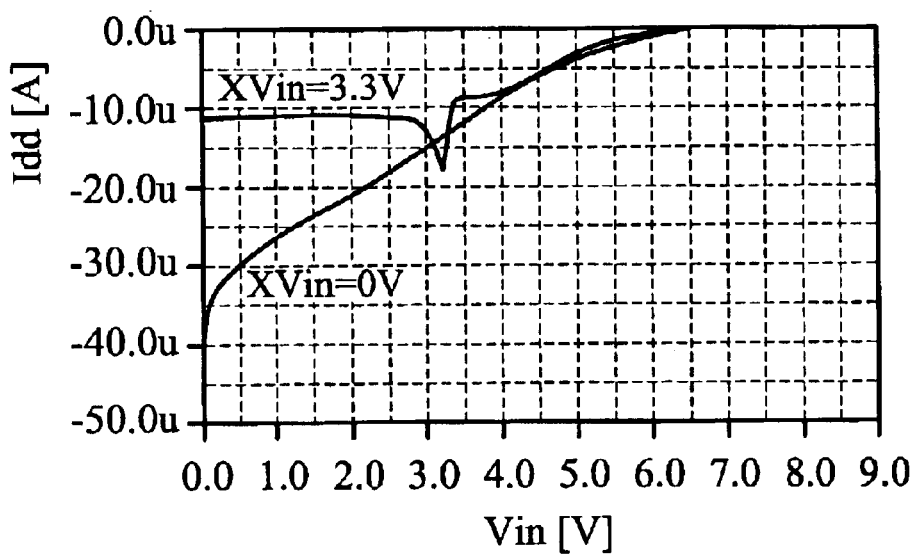
FIG. 3B shows the simulated relationship between the direct current Idd and Vin according to the first embodiment of the present invention.

FIG. 3B shows the simulated relationship between the direct current Idd and Vin according to the first embodiment of the present invention. As shown in FIG. 3B, the direct current provided by the power supply is between about 12 uA and 13 uA when the Vin is between 0V and 3.3V.

Second Embodiment

Figure 4:
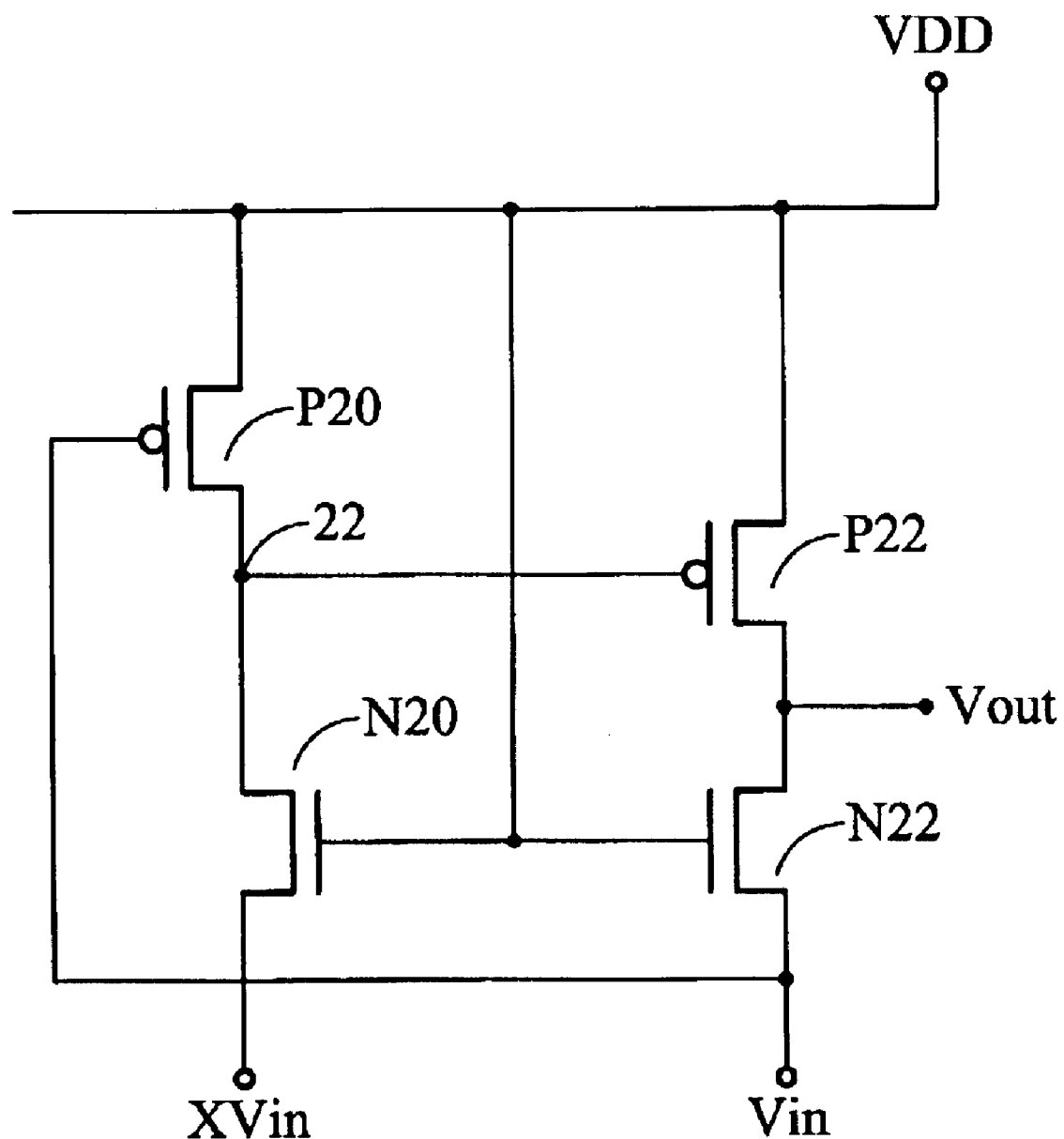
FIG. 4 shows a level shifting circuit according to the second embodiment of the present invention.

FIG. 4 shows a level shifting circuit according to the second embodiment of the present invention. The gate of the PMOS transistor P20 is coupled to an input terminal Vin, and the source of the PMOS transistor P20 is coupled to the outside power source VDD (9V). The drain of the NMOS transistor N20 is coupled to the drain of the PMOS transistor P20, the source of the NMOS transistor N20 is coupled to the inverse input terminal XVin, and the gate of the NMOS transistor N20 is coupled to the outside power source VDD.

The gate of the PMOS transistor P22 is coupled to the drains of the NMOS transistor N20 and PMOS transistor P20. The source of the PMOS transistor P22 is coupled to the outside power source VDD. In addition, the output terminal Vout of the level shifting circuit according to the second embodiment of the present invention is coupled to the drains of the NMOS transistor N22 and PMOS transistor P22. The source of the NMOS transistor N22 is coupled to the input terminal Vin, and the gate of the NMOS transistor N22 is coupled to the outside power source VDD.

The operation of the level shifting circuit according to the second embodiment of the present invention is described below. The voltage levels of the Vin and XVin are inversed. When Vin is high level (3.3V for example), the XVin is low level. The gates of the NMOS transistor N20 and the NMOS transistor N22 are coupled to VDD, so the NMOS transistor N20 and the NMOS transistor N22 are turned on. Therefore, the low level signal provided by the inverse input terminal XVin lowers the voltage level of the connection point 22 to low level. Thus, the PMOS transistor P22 is turned on. Therefore, when the PMOS transistor P22 and the NMOS transistor N22 are turned on, a high voltage level signal of VDD (9V) output from the output terminal Vout is generated by adjusting the resistance of the PMOS transistor P22 and the NMOS transistor N22. Here, the resistances of the transistors are adjusted by changing the input voltage of the gates or by adjusting the size of the transistors.

When Vin is low level, the XVin is high level (3.3V for example). Because the NMOS transistor N22 stays on, the low voltage level signal provided by the input terminal Vin is output from the output terminal Vout.

Figure 5A:
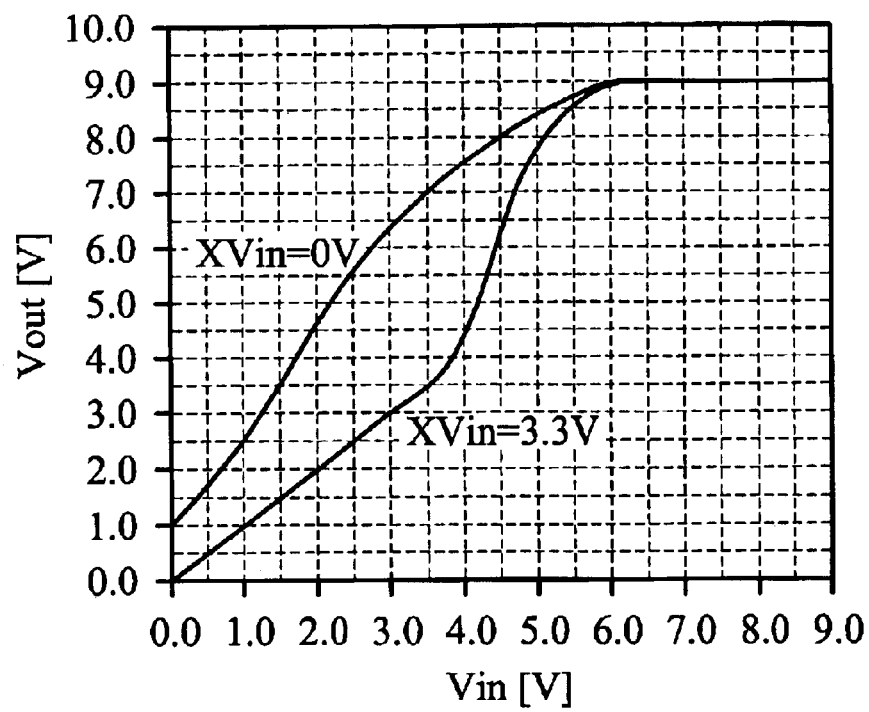
FIG. 5A is the simulated output characteristic chart of the level shifting circuit according to the second embodiment of the present invention.

FIG. 5A is the simulated output characteristic chart of the level shifting circuit according to the second embodiment of the present invention. Here, the threshold voltage of the transistor is 2.5V, the electron mobility is 40 cm$^2$/Vs and W/L is 1. As shown in FIG. 5A, if input voltage Vin is from 0 to 3.3V, the output voltage Vout is between 0 and 7V. Moreover, the level shifting circuit according to the second embodiment of the present invention keeps the output voltage Vout at 0 V when the input voltage Vin is low level.

Figure 5B:
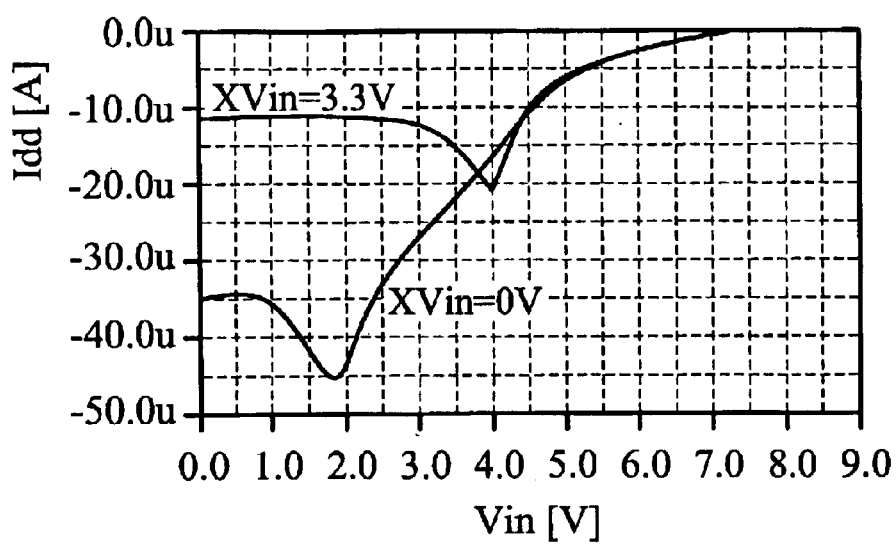
FIG. 5B shows the simulated relationship between the direct current Idd and Vin according to the second embodiment of the present invention.

FIG. 5B shows the simulated relationship between the direct current Idd and Vin according to the second embodiment of the present invention. As shown in FIG. 5B, the direct current provided by the power supply is between about 12 uA and 23 uA when the Vin is between 0V and 3.3V.

Third Embodiment

Figure 6:
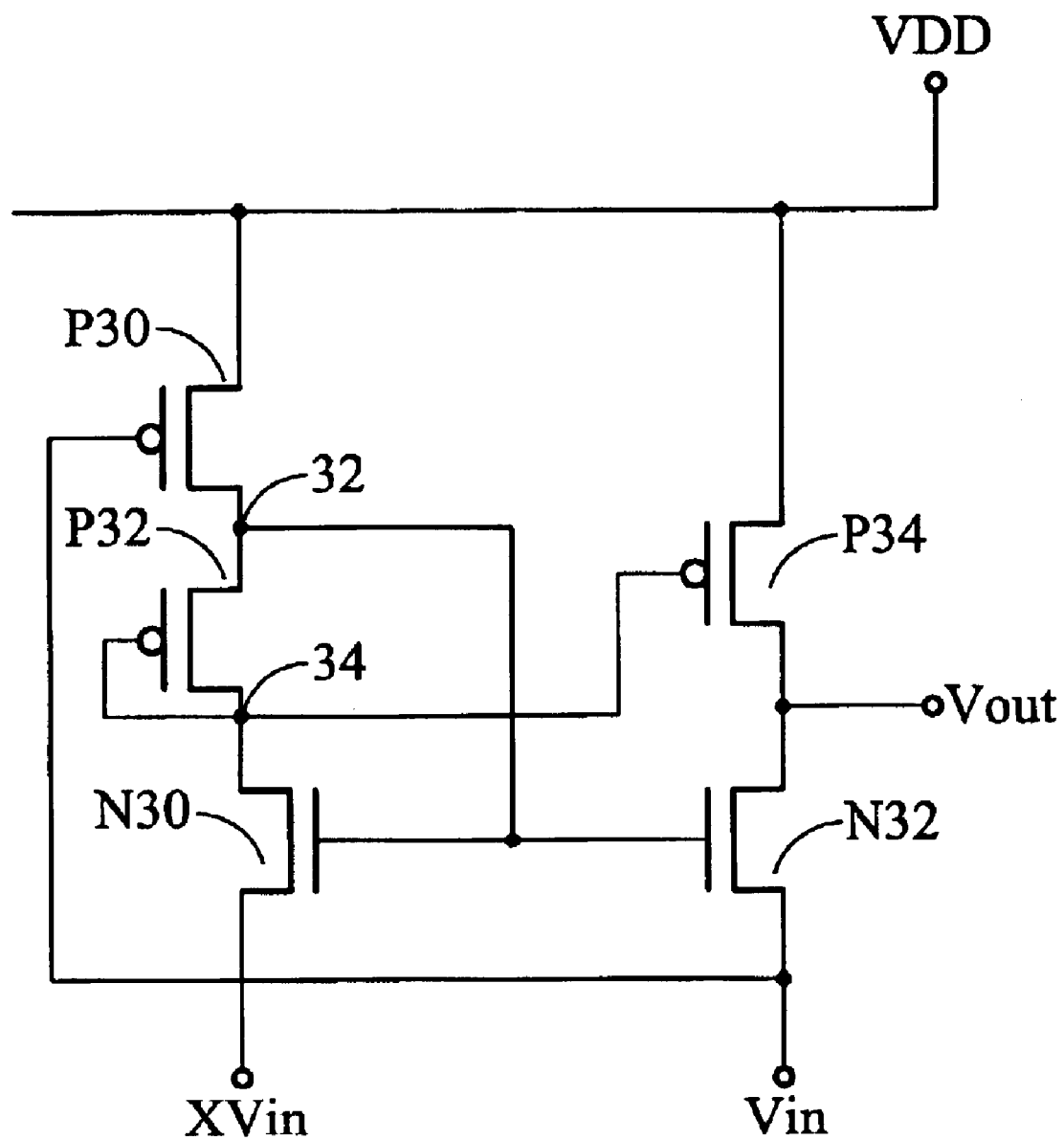
FIG. 6 shows a level shifting circuit according to the third embodiment of the present invention.

FIG. 6 shows a level shifting circuit according to the third embodiment of the present invention. The gate of the PMOS transistor P30 is coupled to an input terminal Vin, the source of the PMOS transistor P30 is coupled to the outside power source VDD (9V). In the present embodiment, the voltage difference element is a PMOS transistor P32. The purpose of the implementation of a voltage difference element is to reduce the current dissipation from the power source, as can be seen from later simulation results. The source of the PMOS transistor P32 is coupled to the drain of the PMOS transistor P30, wherein the connection point is the label 32. The gate and the drain of the PMOS transistor P32 are connected, wherein the connection point is the label 34. However, the voltage difference element can also be a NMOS transistor, a resistor, or a combination of transistors and resistors.

The drain of the NMOS transistor N30 is coupled to the connection point 34, the source of the NMOS transistor N30 is coupled to the inverse input terminal XVin, and the gate of the NMOS transistor N30 is coupled to the outside power source VDD. The gate of the PMOS transistor P34 is coupled to the drains of the NMOS transistor N30 and PMOS transistor P32. The source of the PMOS transistor P32 is coupled to the outside power source VDD. In addition, the output terminal Vout of the level shifting circuit according to the third embodiment of the present invention is coupled to the drains of the NMOS transistor N32 and PMOS transistor P34. The source of the NMOS transistor N32 is coupled to the input terminal Vin, and the gate of the NMOS transistor N32 is coupled to the connection point 32.

The operation of the level shifting circuit according to the third embodiment of the present invention is described below. The voltage levels of the Vin and XVin are inversed. When Vin is high level (3.3V for example), the XVin is low level. The voltage difference between outside power source VDD (9V) and Vin (3.3V) is larger than the threshold voltage of the PMOS transistor P30 (about 2.5V), so the PMOS transistor P30 is turned on. Here, the PMOS transistor P30 is always turned on when the voltage provided by the input terminal is between 0V and 3.3V. The turned-on PMOS transistor P30 raises the voltage level of the connection point 32 then the NMOS transistors N30 and N32 are turned on. In addition, the low level signal provided by the inverse input terminal XVin lowers the voltage level of the connection point 34 to low level. Thus, the PMOS transistor P34 is turned on.

When the PMOS transistor P34 and the NMOS transistor N32 are turned on, a high voltage level signal of VDD (9V) output from the output terminal Vout is generated by adjusting the resistance of the PMOS transistor P34 and the NMOS transistor N32. Here, the resistances of the transistors are adjusted by changing the input voltage of the gates or by adjusting the size of the transistors.

When Vin is low level, and the NMOS transistor N32 stays on, the low voltage level signal provided by the input terminal Vin is output from the output terminal Vout.

Figure 7A:
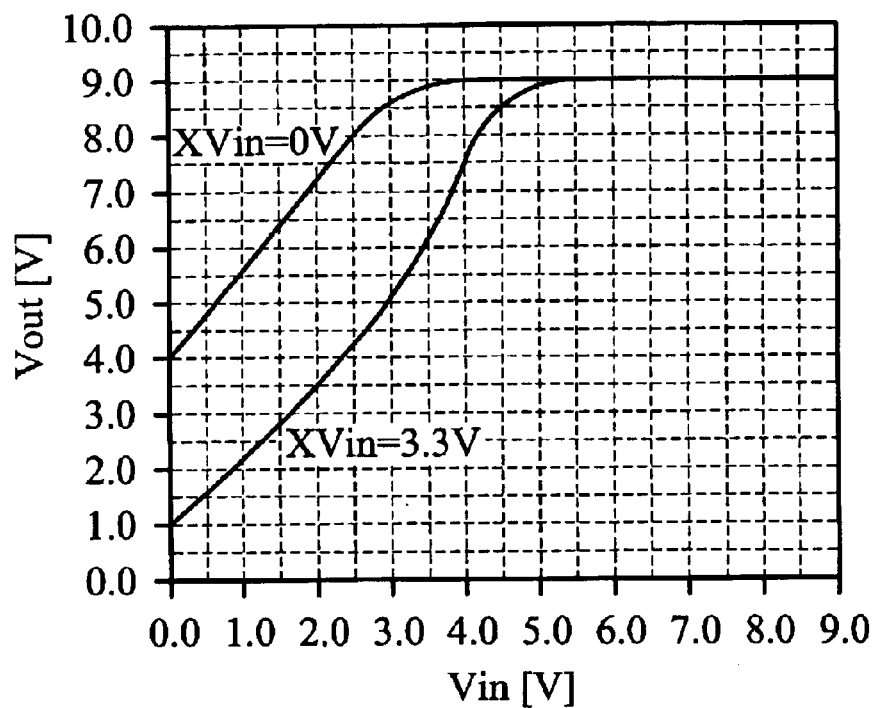
FIG. 7A is the simulated output characteristic chart of the level shifting circuit according to the third embodiment of the present invention.

FIG. 7A shows the simulated output characteristic chart of the level shifting circuit according to the third embodiment of the present invention. Here, the threshold voltage of the transistor is 2.5V, the electron mobility is 40 $cm^2/Vs$ and W/L is 1. As shown in FIG. 7A, if input voltage Vin is from 0 to 3.3V, the output voltage Vout is between 1 and 8.7V.

Figure 7B:
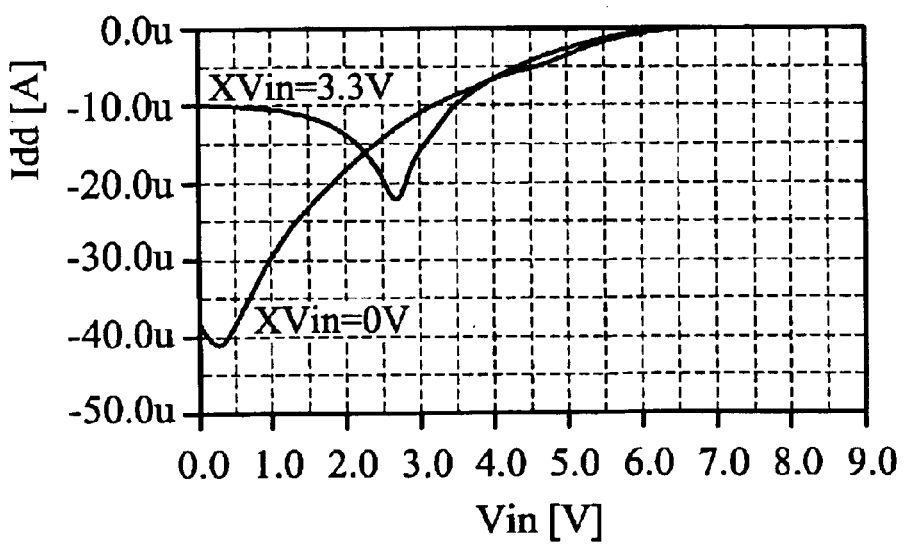
FIG. 7B shows the simulated relationship between the direct current Idd and Vin according to the third embodiment of the present invention.

FIG. 7B shows the simulated relationship between the direct current Idd and Vin according to the second embodiment of the present invention. As shown in FIG. 7B, the direct current provided by the power supply is about 10 uA when the Vin is between 0V and 3.3V. The dissipated current is smaller than that in the previous two embodiments.

Fourth Embodiment

Figure 8:
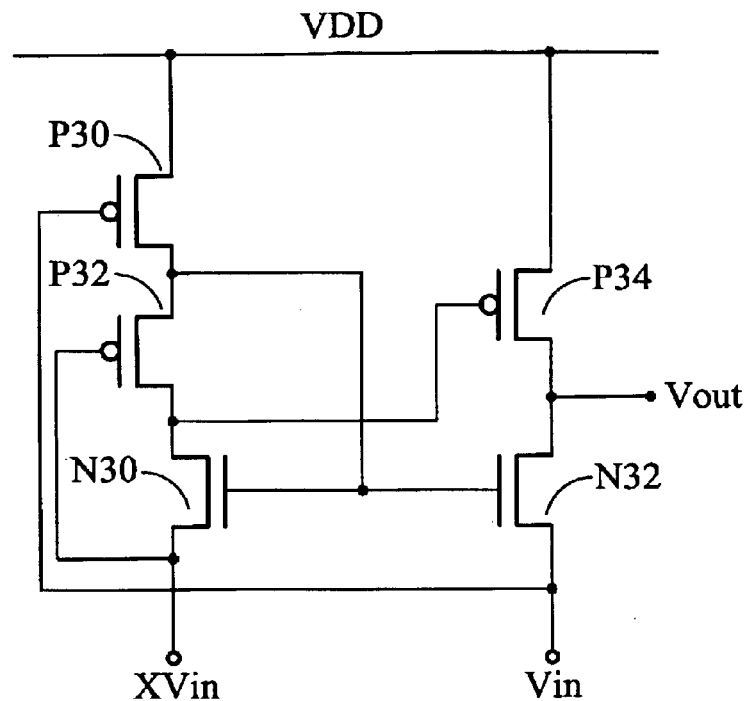
FIG. 8 shows a level shifting circuit according to the fourth embodiment of the present invention.

FIG. 8 shows a level shifting circuit according to the fourth embodiment of the present invention. As shown in FIG. 8, the difference between the level shifting circuits according to the fourth embodiment and the third embodiment is that the gate of the PMOS transistor P32 is coupled to the source of the NMOS transistor N30 replacing that connected to the drain of the PMOS transistor P32. The operation of the level shifting circuit according to the fourth embodiment is similar to the third embodiment.

Fifth Embodiment

Figure 9:
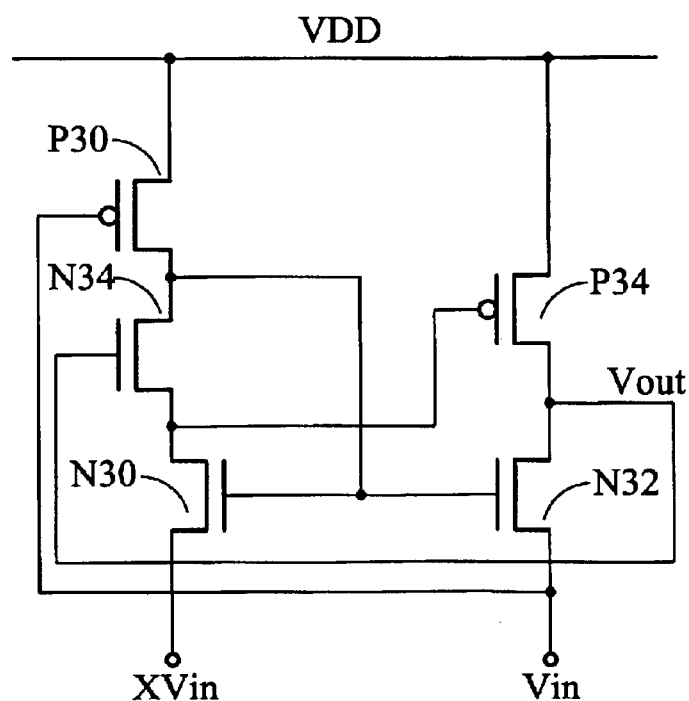
FIG. 9 shows a level shifting circuit according to the fifth embodiment of the present invention.

FIG. 9 shows a level shifting circuit according to the fifth embodiment of the present invention. As shown in FIG. 9, the difference between the level shifting circuits according to the fifth embodiment and the third embodiment is that the PMOS transistor P32 is replaced with NMOS transistor N34, and the gate of the NMOS transistor N34 is coupled to the output terminal. The operation of the level shifting circuit according to the fifth embodiment is similar to the third embodiment.

Sixth Embodiment

Figure 10:
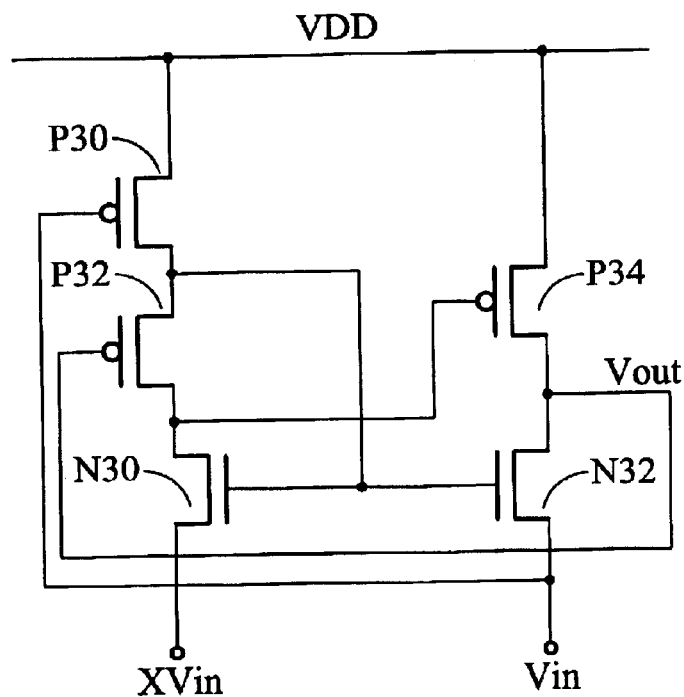
FIG. 10 shows a level shifting circuit according to the sixth embodiment of the present invention.

FIG. 10 shows a level shifting circuit according to the sixth embodiment of the present invention. As shown in FIG. 10, the difference between the level shifting circuits according to the sixth embodiment and the fourth embodiment is that the gate of the PMOS transistor P32 is coupled to the output terminal. The operation of the level shifting circuit according to the sixth embodiment is similar to the third embodiment.

Seventh Embodiment

Figure 11:
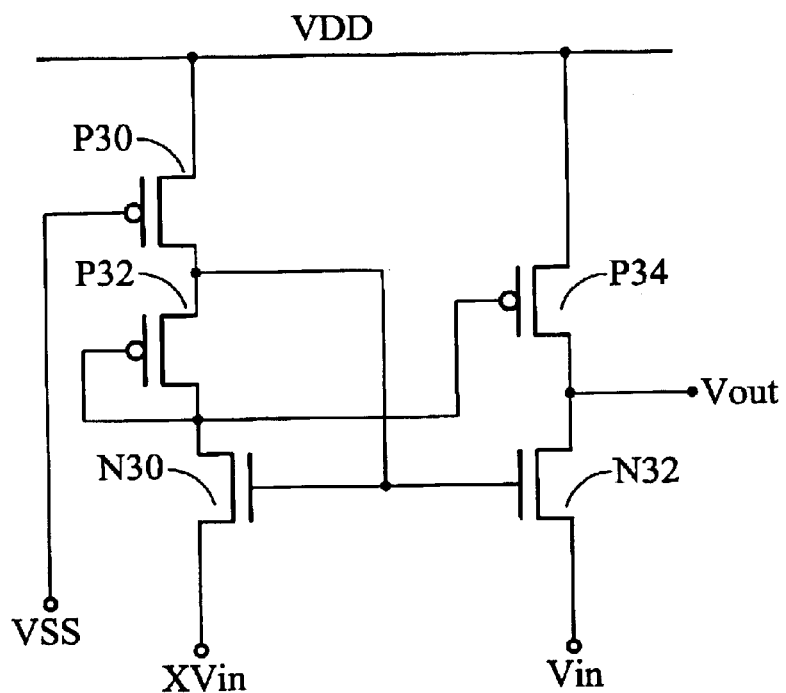
FIG. 11 shows a level shifting circuit according to the seventh embodiment of the present invention.

FIG. 11 shows a level shifting circuit according to the seventh embodiment of the present invention. As shown in FIG. 11, the difference between the level shifting circuits according to the seventh embodiment and the third embodiment is that the gate of the PMOS transistor P30 is coupled to ground, replacing that connected to the input terminal. The operation of the level shifting circuit according to the seventh embodiment is similar to the third embodiment, increasing the turning-on effect of the PMOS transistor P30.

Eighth Embodiment

Figure 12:
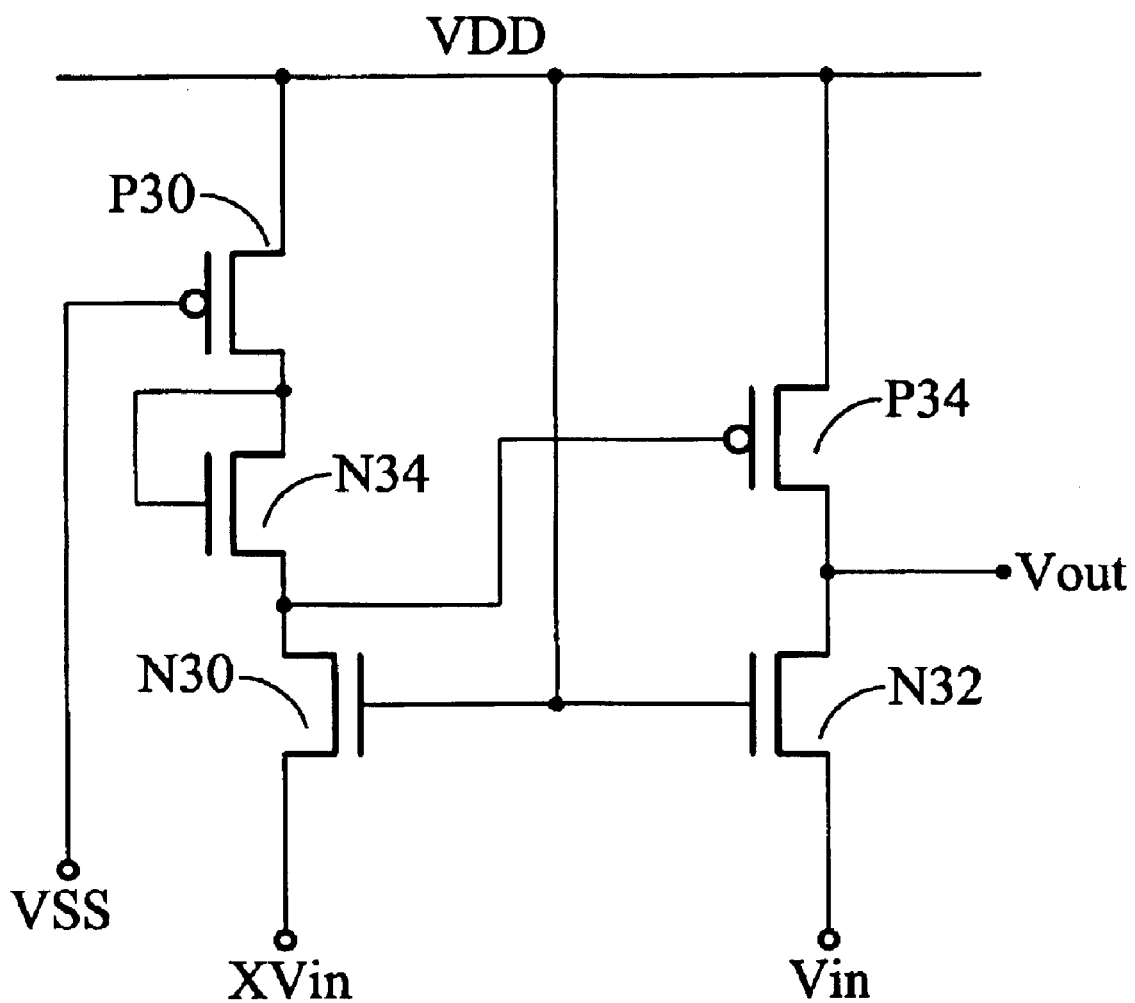
FIG. 12 shows a level shifting circuit according to the eighth embodiment of the present invention.

FIG. 12 shows a level shifting circuit according to the eighth embodiment of the present invention. As shown in FIG. 12, the difference between the level shifting circuits according to the eighth embodiment and the seventh embodiment is that the gate of the PMOS transistor P32 is replaced with the NMOS transistor N34, however, the gate of the NMOS transistor N34 is still connected to its drain. The operation of the level shifting circuit according to the eighth embodiment is similar to the seventh embodiment.

Therefore, in accordance with embodiments from three to eight, the level shifting circuit using a voltage divider as the signal output circuit improves the response of the output signal compared with the digital logic circuit.

Accordingly, the level shifting circuit according to the embodiments of the present invention is suitable for LTPS circuit, having stable output voltage and preventing RC delay during high operation frequency. Moreover, the level shifting circuit according to the embodiments of the present invention uses only a single power source to ensure the NMOS transistors are turned on, and the output high-level signal is VDD and the output low-level signal maintains VSS.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A level shifting circuit, comprising:

a first PMOS transistor having a first drain, a first gate coupled to an input terminal and a first source coupled to a power source;

a first NMOS transistor having a second drain coupled to the first drain, a second source coupled to a reverse input terminal and a second gate coupled to the power source;

a second PMOS transistor having a third gate coupled to the first drain, a third drain coupled to an output terminal and a third source coupled to the power source; and a second NMOS transistor having a fourth gate coupled to the second gate, a fourth drain coupled to the output terminal and a fourth source coupled to the input terminal.

2. A level shifting circuit, comprising:

a first PMOS transistor having a first drain, a first gate coupled to an input terminal and a first source coupled to a power source;

a voltage difference element having a first terminal coupled to the first drain, and a second terminal;

a second PMOS transistor having a second source coupled to the power source, a second gate coupled to the second terminal and a second drain coupled to an output terminal;

a first NMOS transistor having a third drain coupled to the second gate, a third gate coupled to the first drain and a third source coupled to a reverse input terminal; and a second NMOS transistor having a fourth source coupled to the input terminal, a fourth drain coupled to the output terminal and a fourth gate coupled to the first drain.

3. The level shifting circuit as claimed in claim 2, wherein the voltage difference element is a third PMOS transistor having a fifth drain coupled to the second gate, a fifth source coupled to the first drain, and a fifth gate coupled to the fifth drain.

4. The level shifting circuit as claimed in claim 2, wherein the voltage difference element is a NMOS transistor, a resistor or a combination thereof.

5. The level shifting circuit as claimed in claim 2, wherein the voltage difference element is a third PMOS transistor having a fifth drain coupled to the second gate, a fifth source coupled to the first drain, and a fifth gate coupled to the reverse input terminal.

6. The level shifting circuit as claimed in claim 2, wherein the voltage difference element is a third PMOS transistor having a fifth drain coupled to the second gate, a fifth source coupled to the first drain, and a fifth gate coupled to the output terminal.

7. The level shifting circuit as claimed in claim 2, wherein the voltage difference element is a third PMQS transistor having a fifth source coupled to the second gate, a fifth drain coupled to the first drain, and a fifth gate coupled to the output terminal.

8. A level shifting circuit, comprising:

a first PMOS transistor having a first drain, a first source coupled to a first power source and a first gate coupled to a second power source;

a voltage difference element having a first terminal coupled to the first drain, and a second terminal;

a second PMOS transistor having a second source coupled to the first power source, a second gate coupled to the second terminal and a second drain coupled to an output terminal;

a first NMOS transistor having a third drain coupled to the second gate, a third gate coupled to the first drain and a third source coupled to a reverse input terminal; and a second NMOS transistor having a fourth source coupled to the input terminal, a fourth drain coupled to the output terminal and a fourth gate coupled to the first drain.

9. The level shifting circuit as claimed in claim 8, wherein the voltage difference element is a third PMOS transistor having a fifth drain coupled to the second gate, a fifth source coupled to the first drain, and a fifth gate coupled to the fifth drain.

10. The level shifting circuit claimed in claim 8, wherein the voltage difference element is a NMOS transistor, a resistor or a combination thereof.

11. The level shifting circuit as claimed in claim 8, wherein the voltage difference element is a third PMOS transistor having a fifth source coupled to the second gate, a fifth drain coupled to the first drain, and a fifth gate coupled to the fifth drain.

* * * * *